United States Patent [19]
Koyama

[11] Patent Number: 5,604,382
[45] Date of Patent: Feb. 18, 1997

[54] SEMICONDUCTOR DEVICE WITH PILLAR-SHAPED CONTACT LAYER

[75] Inventor: Kuniaki Koyama, Tokyo, Japan

[73] Assignee: NEC Corporation, Tokyo, Japan

[21] Appl. No.: 346,302

[22] Filed: Nov. 23, 1994

[30] Foreign Application Priority Data

Nov. 25, 1993 [JP] Japan ................... 5-318939

[51] Int. Cl.⁶ ............... H01L 29/40; H01L 27/04
[52] U.S. Cl. ............. 257/774; 257/758; 257/382; 257/385; 257/754; 257/756
[58] Field of Search ............ 257/758, 754–757, 257/760, 774, 752, 382, 385, 756, 306

[56] References Cited

U.S. PATENT DOCUMENTS

| | | | |
|---|---|---|---|
| 4,713,356 | 12/1987 | Hiruta | 257/752 |
| 4,767,724 | 8/1988 | Kim et al. | 257/752 |
| 4,800,176 | 1/1989 | Kakumu et al. | 257/757 |
| 4,833,519 | 5/1989 | Kawano et al. | 257/756 |
| 5,084,405 | 1/1992 | Fazan et al. | 257/306 |
| 5,091,768 | 2/1992 | Yamazaki | 257/758 |
| 5,126,825 | 6/1992 | Harada | 257/752 |
| 5,162,881 | 11/1992 | Ohya | 257/758 |
| 5,172,202 | 12/1992 | Kazuo | 257/758 |
| 5,187,638 | 2/1993 | Sandhu et al. | 257/306 |
| 5,235,199 | 8/1993 | Hamamoto et al | 257/756 |
| 5,243,220 | 9/1993 | Shibata et al. | 257/774 |
| 5,442,213 | 8/1995 | Okudaira et al. | 257/752 |
| 5,444,022 | 8/1995 | Gardner | 437/195 |

FOREIGN PATENT DOCUMENTS

| | | | |
|---|---|---|---|
| 0078573 | 5/1984 | Japan | 257/755 |
| 60-106163 | 6/1985 | Japan . | |
| 0061358 | 3/1987 | Japan | 257/757 |
| 1-241857 | 9/1989 | Japan . | |
| 0003955 | 1/1990 | Japan | 257/752 |
| 0115554 | 4/1992 | Japan | 257/757 |
| 0267214 | 10/1993 | Japan | 257/755 |
| 5-343351 | 12/1993 | Japan . | |

*Primary Examiner*—Sara W. Crane
*Assistant Examiner*—Alexander Oscar Williams
*Attorney, Agent, or Firm*—Sughrue, Mion, Zinn, Macpeak & Seas

[57] ABSTRACT

A semiconductor device comprises a first conductive layer, an insulating layer formed on the first conductive layer, a plurality of contact holes formed through the insulating layer, a second conductive layer consisting of a plurality of pillar-shaped contacts each respectively formed in a corresponding one of the contact holes, the pillar-shaped contacts each respectively having a projecting portion projecting above the insulating layer, and a third conductive layer consisting of a plurality of conductive portions each respectively formed on the projecting portion of a corresponding one of the pillar-shaped contacts in a selectively growing manner.

21 Claims, 7 Drawing Sheets

SEMICONDUCTOR DEVICE WITH PILLAR-SHAPED CONTACT LAYER

BACKGROUND OF THE INVENTION

The present invention relates to a layered semiconductor device and a manufacturing process thereof, and particularly to a semiconductor device having a layered structure including a conductive layer consisting of minute pillar-like contacts for conduction between overlapping conductive layers such as a diffusion layer, an electrode layer and a wiring conductor layer, and to a process for manufacturing the same.

DESCRIPTION OF THE RELATED ART

Recent years have observed an enhanced circuit integration by an increased density with a progressively increased tendency to reduce the sectional area of interlayer contacts as well as the margin to be secured therefor in relation to wiring conductors or to electrodes, such as a lower electrode of a stacked cell in a DRAM (dynamic random access memory).

To show an example of such the state of art, description will now be made of the structure and some associated process steps of a lower electrode of a stack type capacitor cell in a conventional DRAM according to the Japanese Patent Application Laid-Open Publication No. 60(1985)-106163.

FIGS. 1A and 1B are transverse partial sectional views describing the process steps for forming the lower electrode in this first example. Designated at reference numeral 101 is a p-type silicon substrate, 102 is an oxided field film for inter-element separation, 103 is an oxided gate film for insulation, 104 is a gate electrode, 105 is a diffusion layer, 106 is a silicon oxide film for insulation, 108 is a polycrystalline silicon contact layer constituting an interior portion of the lower electrode, and 109 is a polycrystalline silicon layer constituting an upper exterior portion of the lower electrode.

In the present example, to form the lower electrode, the polycrystalline silicon layer 108 is patterned as shown in FIG. 1A and has the polycrystalline silicon layer 109 selectively grown thereon as shown in FIG. 1B.

According to the present example, the lower electrode can provide a larger capacitor area than obtainable simply by a patterning accuracy.

To show another example of the state of art, description will now be made of the structure and some associated process steps of a lower electrode of a stack type capacitor cell in another conventional DRAM according to the Japanese Patent Application Laid-Open Publication No. 1(1989)-241857.

Fills. 2A and 2B are transverse partial sectional views describing the process steps for forming the lower electrode in this second example, in which like or corresponding parts to the first example are designated at like reference numerals to FIGS. 1 and 2. Designated at reference numeral 109 in FIG. 2B is a polycrystalline silicon layer constituting the lower electrode.

In the present example, to form the lower electrode, an insulating silicon oxide film 106 with contact holes opened therethrough as shown in FIG. 2A has the polycrystalline silicon layer 109 directly grown thereon by a selective VPE (vapor phase epitaxy) method as shown in FIG. 2B.

According to the present example, the lower electrode including a contact portion can be formed in a self-matching manner, eliminating considerations that otherwise would have been needed to compensate positional diviations due to a photo-etching.

To show an example of an advanced state of art, description will now be made of the structure and some associated process steps of a layered structure including a pillar-like contact layer disposed under a wiring conductor layer in a semiconductor device according to an earlier patent application that has been filed on Jun. 8, 1992 to the Japanese Patent Office and laid open for public inspection on Dec. 24, 1993 in the Japanese Patent Application Laid-Open Publication No. 5(1993)-343351.

FIGS. 3A to 3E are partial sectional views describing the process steps for forming the layered structure in this third example, in which like or corresponding parts to the first conventional example are designated at like reference numerals to FIGS. 1 and 2. Namely, designated at reference numeral 101 is a p-type silicon substrate as a first conductive layer including a diffusion layer 105, and 106 is a silicon oxide film for insulation. Designated at reference numeral 107 is a silicon nitride film for a masking use, 108 is a polycrystalline silicon contact layer as a second conductive layer, 112 is a silicon oxide layer for insulation and anti-etching purposes, and 113 is a wiring conductor layer as a third conductive layer.

In the present example, to form the layered structure, the silicon oxide film 106 and the silicon nitride film 107 formed thereon have opened through both of them a necessary number of contact holes reaching the diffusion layer 105 in a surfacial region of the silicon substrate 101, before having the polycrystalline silicon layer 108 grown thereon as shown in FIG. 3A. In the next step, this polycrystalline silicon layer 108 is etched back into burried pillar-like contacts having their top surfaces flush with the upside of the silicon nitride film 107 as shown in FIG. 3B. Next, the burried contacts 108 have their top portions oxidized to form the silicon oxide layer 112 shown in FIG. 3C. In a subsequent step, the silicon nitride layer 107 is removed by an etching as shown in FIG. 3D. Then, a metallic layer is formed on the silicon oxide film 106 and the silicon oxide layer 112 and around the upper parts of the contacts 108 and patterned by an etching to form the wiring conductor layer 113 shown in FIG. 3E.

According to the present example, in the patterning for formation of the wiring conductor layer 113, the silicon oxide layer 112 formed on each polycrystalline silicon contact 108 can serve as an anti-etching member for preventing substantially straightly acting etching chemicals from attacking into depth of the contact 108, digging into the diffusion layer 105 and the silicon substrate 101, even if a deficient or defective mapping happened so that an associated wiring pattern mapped on an overlapping photo-resist film had a positionally deviated pattern edge close to or stride over the silicon oxide layer 112.

The foregoing three examples however have their disadvantages.

The first example (FIGS. 1A and 1B) needs, in formation of the interior portion 108 of a lower electrode layer before having the exterior portion 109 thereof selectively grown, a relatively wide mapping margin to be provided between the circumference of the interior portion 108 and that of a contact portion thereof, thus failing to accept an enhanced integration with a very fine electrode portion to be accompanied with a correspondingly fine contact portion.

The second example (FIGS. 2A and 2B) can effectively solve this problem. In the second example, however, the lower electrode layer 109 has its height determined in dependence on the spacing distance between adjacent ones of the separated electrode portions, thus failing to accept an enhanced integration with an increased capacity to be achieved by increasing the area of a vertical side face of each electrode portion having a frustum-like section.

The third example (FIGS. 8A to 3E) can eliminate conventional considerations of a required mapping margin around a contact portion. However, in the third example in which an electric current is conducted between the diffusion layer 105 as part of the first conductive layer and the wiring conductor layer 113 as the third conductive layer through the pillar-like contact layer 108 as the second conductive layer, the current conduction between the second conductive layer and the third conductive layer is effected through a limited contact region along an upper side face of the former, thus resulting in an increased contact resistance.

SUMMARY OF THE INVENTION

The present invention has been achieved with the foregoing points in mind. It is therefore an object of the present invention to provide a semiconductor device permitting a spacing distance between electrodes to be designed smaller than a limit based on a pattern recognition faculty while concurrently giving an increased height to the electrodes, without considerations of a conventionally required margin for a deviated mapping around a contact, as well as an increased contact region between a contact and an electrode to achieve a reduced contact resistance, when the electrode is disposed under a wiring conductor. It also is an object of the present invention to provide a method for manufacturing the semiconductor device.

To achieve the object, a genus of the present invention provides a semiconductor device comprising a first conductive layer, an insulating layer formed on the first conductive layer, a plurality of contact holes formed through the insulating layer, a second conductive layer consisting of a plurality of pillar-shaped contacts each respectively formed in a corresponding one of the contact holes, the pillar-shaped contacts each respectively having a projecting portion projecting above the insulating layer, and a third conductive layer consisting of a plurality of conductive portions each respectively formed on the projecting portion of a corresponding one of the pillar-shaped contacts in a selectively growing manner.

In the semiconductor device according to the genus of the present invention, an electric current is conducted from the first conductive layer to the third conductive layer or vice versa, through the second conductive layer consisting of the pillar-shaped contacts each respectively having a burried portion in one of the contact holes, the burried portion contacting at the bottom thereof with the first conductive layer, and the projecting portion contacting with a corresponding one of the conductive portions of the third conductive layer.

According to the genus of the present invention, the projecting portion of each of the pillar-shaped contacts has a corresponding one of the conductive portions of the third conductive layer formed thereon in a selectively growing manner.

To achieve an enhanced integration, an arbitrary one of the pillar-shaped contacts can have a neighboring one spaced therefrom at a minimal distance corresponding to a limit of pattern recognition, permitting a selectively grown conductive part on a side face of the arbirary pillar-shaped contact and that of the neighboring one to be spaced from each other at a smaller distance than the minimal distance, concurrently permitting each pillar-shaped contact to have an increased height by a selectively grown conductive part on a top face thereof. Moreover, each conductive portion selectively grown on one of the pillar-shaped contacts needs no pattern mapping for the formation, thus eliminating conventional considerations for a deviated mapping around a contact.

According to a species of the present invention, each of the conductive portions of the third conductive layer is formed on a substantially entire surface of the projecting portion.

According to another species of the present invention, a selected surface region of the projecting portion comprises a first crystalline, and each of the conductive portions of the third conductive layer comprises a second crystalline selectively growable on the first crystalline. The first and the second crystalline may preferably comprise a polycrystalline silicon.

According to another species of the present invention, the projecting portion has the same sectional size as the corresponding one of the contact holes.

According to another species of the present invention, each of the pillar-shaped contacts comprise a first contact formed in the corresponding one of the contact holes, the first contact being formed with a recess, and a second contact formed in the recess of the first contact. The first contact may preferably have a higher coverage property than the second contact. The first contact may preferably have a lower resistivity than the second contact.

According to another species of the present invention, the semiconductor device further comprises a capacitive insulation layer formed on the third conductive layer.

According to another species of the present invention, the first conductive layer comprises a diffusion layer formed in a semiconductive substrate, and each of the conductive portions of the third conductive layer comprises an electrode. The electrode may preferably comprise a lower electrode of a capacitor layer.

According to another species of the present invention, the first conductive layer comprises a diffusion layer formed in a semiconductive substrate, and each of the conductive portions of the third conductive layer comprises a wiring conductor.

According to another species of the present invention, the first conductive layer comprises a wiring conductor layer, and the third conductive layer comprises another wiring conductor layer.

According to another species of the present invention, the semiconductor device further comprises another insulating layer consisting of a plurality of insulating portions each respectively formed on a top face of the projecting portion, and a side face of the projecting portion has formed thereon a corresponding one of the conductive portions of the third conductive layer. Each of the insulating portions may preferably have the same sectional size as a corresponding one of the contact holes.

According to another species of the present invention, the semiconductor device further comprises a fourth conductive layer consisting of a plurality of conductive portions each respectively formed on a corresponding one of the conductive portions of the third conductive layer. Each of the conductive portions of the fourth conductive layer may preferably comprise a wiring conductor.

According to another species of the present invention, the semiconductor device further comprises another insulating layer consisting of a plurality of insulating portions each respectively formed on a top face of the projecting portion, and a fourth conductive layer consisting of a plurality of conductive portions each respectively formed on a corresponding one of the conductive portions of the third conductive layer, and a side face of the projecting portion has formed thereon a corresponing one of the conductive portions of the third conductive layer. Each of the insulating portions may preferably have the same sectional size as a corresponding one of the contact holes.

To achieve the described object, another genus of the present invention provides a process for manufacturing a semiconductor device, comprising the steps of providing a substrate with a first conductive layer, forming an insulating layer on the first conductive layer, forming a masking layer on the insulating layer, opening in the masking layer and the insulating layer a plurality of straight holes each respectively extending therethrough with a predetermined sectional size to the first conductive layer, having a second conductive layer growing in the straight holes and over the masking layer, removing a grown portion of the second conductive layer over the masking layer while leaving a plurality of grown portions of the second conductive layer in the straight holes, removing the masking layer so that the grown portions of the second conductive layer in the straight holes have exposed parts thereof projecting over the insulating layer, and forming a third conductive layer by having a plurality of conductive portions thereof each respectively grown on a corresponding one of the exposed parts of the second conductive layer in a selectively growing manner.

According to a species of the present invention, the second conductive layer comprises a first crystalline, and the third conductive layer comprises a second crystalline selectively, grownable on the first crystalline. The first and the second crystalline may preferably comprise a polycrystalline silicon.

BRIEF DESCRIPTION OF THE DRAWINGS

The objects, features and advantages of the present invention will become more apparent from consideration of the following detailed description, taken in conjunction with the accompanying drawings, in which.

DESCRIPTION OF THE PREFERRED EMBODIMENTS

There will be detailed below preferred embodiments of the present invention, with reference to FIGS. 4 to 12.

Figure 1A:
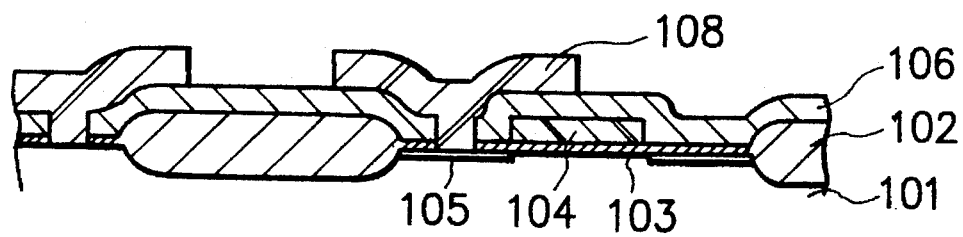
FIGS. 1A and 1B are transverse partial sectional views describing two process steps for forming a lower electrode in accordance with an example of the state of art.
Figure 1B:
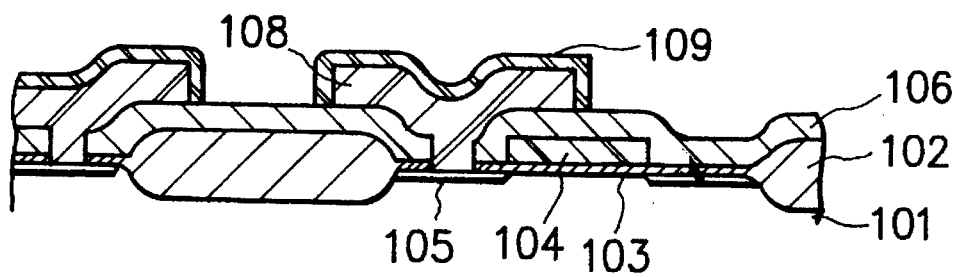
Figure 2A:
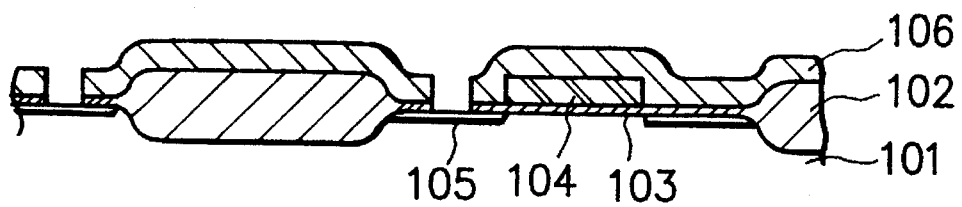
FIGS. 2A and 2B are transverse partial sectional views describing two process steps for forming a lower electrode in accordance with another example of the state of art.
Figure 2B:
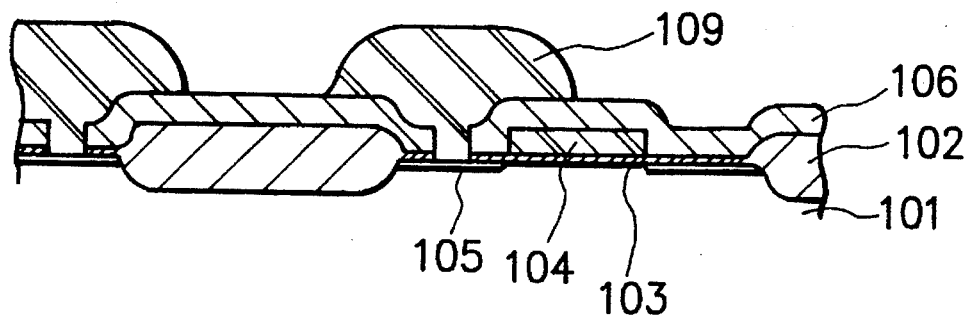
Figure 3A:
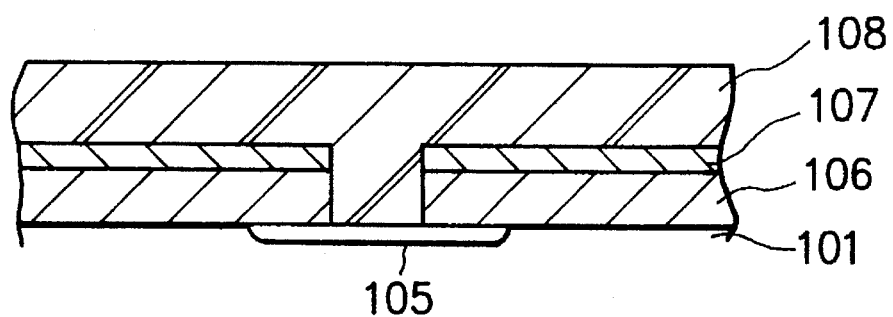
FIGS. 3A to 3E are transverse partial sectional views describing a series of process steps for forming a laminated or layered structure in accordance with an example of an advanced state of art.
Figure 3B:
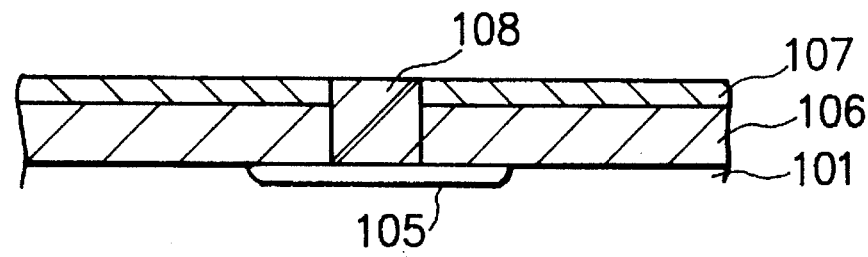
Figure 3C:
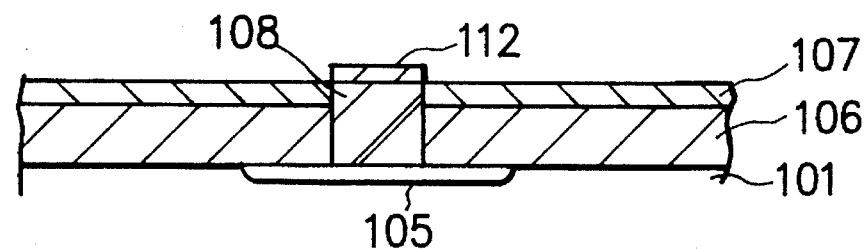
Figure 3D:
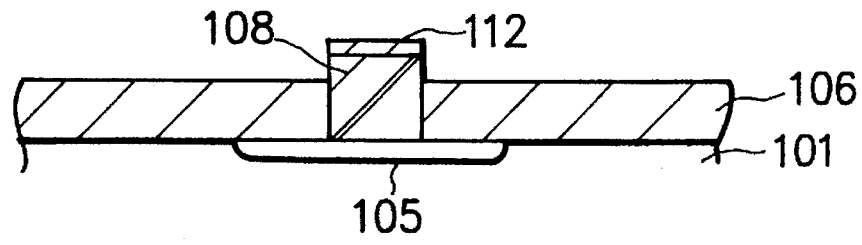
Figure 3E:
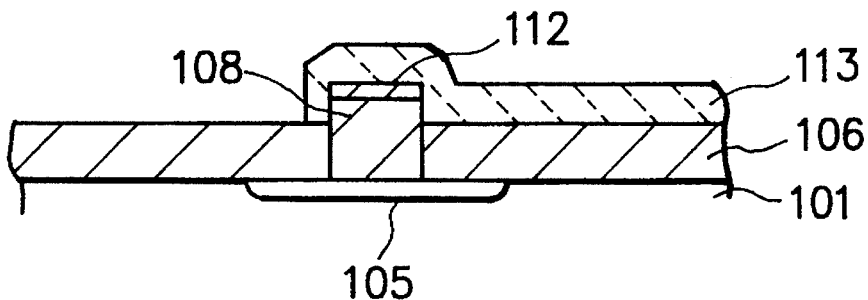
Figure 4:
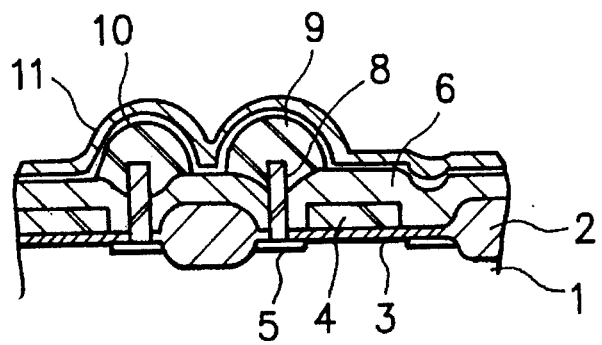
FIG. 4 is a transverse partial sectional view of a semiconductor device according to an embodiment of the present invention.

FIG. 4 illustrates a laminated or layered structure of an essential part of a semiconductor device as a DRAM-oriented unipolar IC according to an embodiment of the present invention, in which reference numerals are employed each respectively to collectively designate a layer or film member and a component thereof. Designated at reference numeral 1 is a p-type silicon substrate as a first conductive layer including all $n^+$ diffusion layer 5 consisting of a plurality of sources or drains formed in surface regions of the substrate, 2 is a silicon oxide film formed as an interelement (FET-FET) isolation film or field oxide film on the substrate 3 is a gate insulating silicon oxide film formed as a gate oxide film on the substrate, 4 is a polycrystalline silicon layer consisting of a plurality of gate electrodes formed on the gate oxide film, 10 is a capacitive insulation film made of $Si_3N_4$ or another suitable dielectric substance such as an oxidized silicon nitride, and 11 is an upper electrode layer made of a polycrystalline silicon. The substrate 1 serves as a p-type channel in a MOS FET element.

The semiconductor device according to the embodiment illustrated in FIG. 4 comprises the silicon substrate 1 as the first conductive layer including the diffusion layer 5, an interlayer insulating silicon oxide layer or film 6 formed on the first conductive layer, a plurality of contact holes formed through the insulating layer 6, a second conductive layer consisting of a plurality of polycrystalline silicon pillar-shaped contacts 8 each respectively formed in a corresponding one of the contact holes, the pillar-like contacts 8 each respectively having a projecting portion projecting above the insulating layer 6, and a third conductive layer as a lower electrode layer consisting of a plurality of conductive polycrystalline silicon portions 9 each respectively formed on the projecting portion of a corresponding one of the pillar-like contacts 8 in a selectively growing manner, and besides the capacitive insulation film 10, the upper electrode layer 11 as well as the field isolation film 2, the gate oxide film 4 and the gate electrode layer 4, while the gate oxide film 4 is deemed herein a part of the insulation layer.

In the semiconductor device of FIG. 4, an electric current is conducted from the first conductive layer 1 to the third conductive layer or vice versa, through the second conductive layer consisting of the pillar-like contacts 8 each respectively having a burried portion in one of the contact holes, the burried portion contacting at the bottom thereof with the diffusion layer 5 of the first conductive layer 1, and the projecting portion contacting with a corresponding one of the conductive portions 9 of the third conductive layer.

To achieve an enhanced integration, an arbitrary one of the pillar-like contacts 8 can have a neighboring one spaced therefrom at a minimal distance corresponding to a limit of pattern recognition, permitting a selectively grown conductive part of the layer 9 on a side face of the arbirary pillar-like contact 8 and that of the neighboring one to be spaced from each other at a smaller distance than the minimal distance, concurrently permitting each pillar-like contact 8 to have an increased height by a selectively grown conductive part of the layer 9 on a top face thereof. Moreover, each conductive portion of the layer 9 selectively grown on one of the pillar-like contacts 8 needs no pattern mapping for the formation, thus eliminating conventional considerations for a deviated mapping around a contact.

Each of the conductive portions 9 of the third conductive layer is formed on substantially the entire surface of the projecting portion of the pillar-like contact 8.

Description will now be made of a process for manufacturing the laminated structure of the semiconductor device of FIG. 4 in accordance with an embodiment of the present invention, with reference to FIGS. 5A to 5D and 6A to 6D.

The substrate 1 is formed through a series of well known process steps for manufacturing a wafer.

Figure 5A:
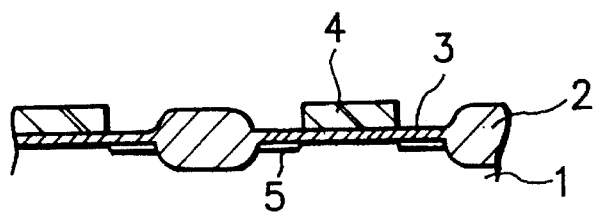
FIGS. 5A to 5D and 6A to 6D are transverse partial sectional views describing a series of process steps for forming a laminated or layered structure of the semiconductor device of FIG. 4.

The field oxide film 2 and the gate oxide film 3 shown in FIG. 5A are formed on the substrate 1 by a LOGOS (local oxidation of silicon) method to thicknesses of about 5000 Å and about 200 Å, respectively. Then, a polycrystalline silicon is laminated up to a thickness of about 3000 Å on the oxide film 3 before a patterning thereof to form the gate electrode 4. Thereafter, a predetermined amount of dopant of an inverse conduction type to the substrate is injected, e.g. $1.0 \times 10^{15}$ cm$^{-2}$ arsenic ion particles are, injected by an acceralation energy level of 50 keV, in a self-matching manner with respect to the patterned gate electrode 4, to thereby form the diffusion layer 5 as shown in FIG. 5A.

Figure 5B:
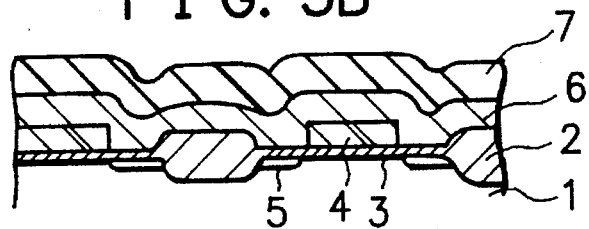

Then, as shown in FIG. 5B, the silicon oxide layer or film 6 and a silicon nitride film 7 as a masking layer are laminated in this order by a CVD (chemical vapor deposition) method up to thicknesses of about 2000 Å and about 4000 Å, respectively.

Figure 5C:
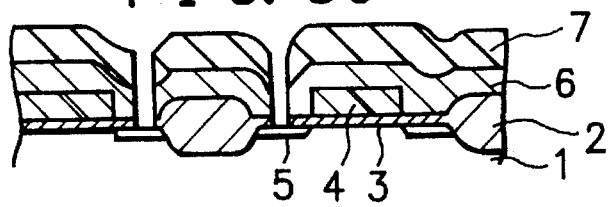

Then, as shown in FIG. 5C, the silicon nitride film 7, the silicon oxide film 6 and the gate oxide film 3 are partially etched off to open therethrough a plurality of straight holes each respectively vertically extending with a predetermined sectional size from a location of a corresponding one of the lower electrodes to the diffusion layer 5 of The first conductive layer. The lower part of each of the straight hole constitutes a corresponding one of the contact holes.

Figure 5D:
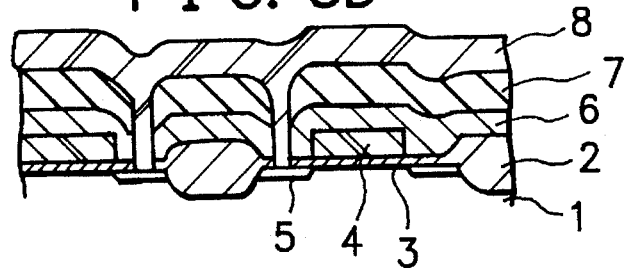

Then, as shown in FIG. 5D, the polycrystalline silicon 8 is permitted to grow in the straight holes and over the masking layer up to a thickness of about 3000 Å.

Figure 6A:
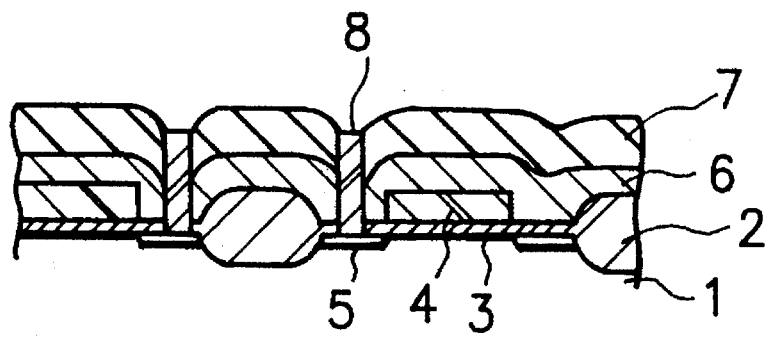
Figure 6B:
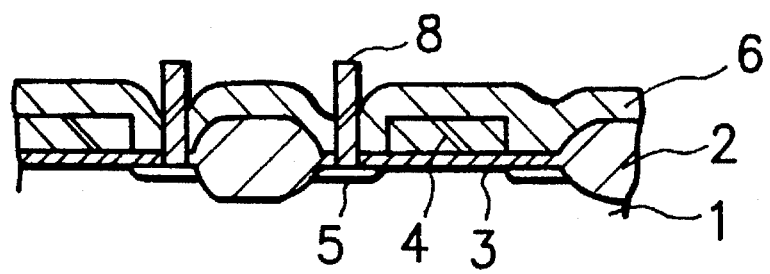

Then, as shown in FIG. 6A, the polycrystalline silicon 8 is aerotropically or anisotropically etched off, so that a grown portion of the second conductive layer 8 over the masking layer 7 is removed while a plurality of grown portions of the second conductive layer 8 in the straight holes are left as they are.

Then, as shown in FIG. 68, the silicon nitride film 7 is etched oil so that the grown portions of the second conductive layer 8 in the straight holes have exposed parts thereof projecting over the insulating layer 6. The second conductive layer is now given in the form of vertically standing pillar-like contacts.

Figure 6C:
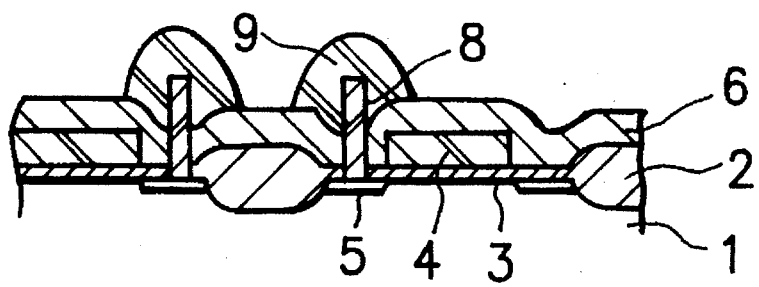

Then, as shown in FIG. 6C, the polycrystalline silicon 9 is permitted to selectively grow on the projecting portion of each pillar-like contact 8 up to a thickness of about 1500 Å to thereby form a corresponding one of the conductive portions of the third conductive layer as the lower electrode layer. The polycrystalline silicon 9 may be substituted by another substance selectively growable on the projecting portion of each pillar-like contact 8.

Figure 6D:
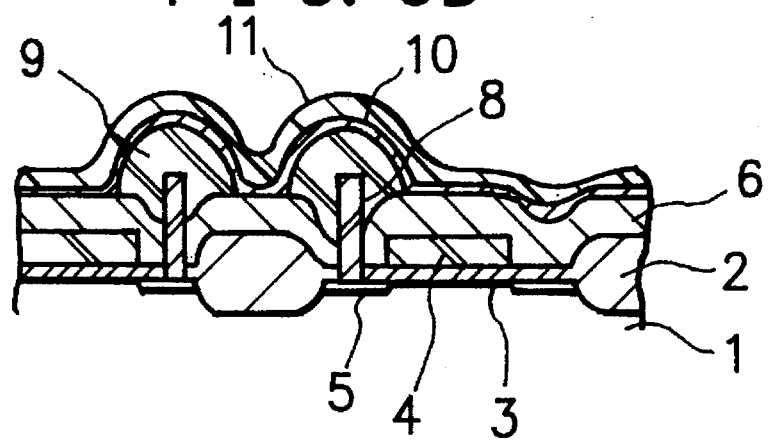

Then, as shown in FIG. 6D, exemplarily a silicon oxide film is permitted to grow by a CVD method up to a thickness of about 100 Å before the oxidation to form the capacitive insulation layer 10. Then, a polycrystalline silicon is laminated on the capacitive insulation layer 10 up to a thickness of about 2000 Å to form the upper electrode layer 11. The laminated structure shown in FIG. 4 is now completed.

According to the manufacturing process described, the thickness of the silicon nitride film 7 is variable or controllable to thereby control the length of the projecting portion of each pillar-like contact 8, permitting a height control of the lower electrode layer 9, so that each selectively growable electrode 9 can have an increased surface area free from a spacing distance thereof to a neighboring electrode.

Moreover, each lower electrode 9 selectively grown on one of the pillar-like contacts 8 needs no pattern mapping for the formation, thus eliminating a conventional margin for a deviated mapping around a contact.

Description will now be made of another embodiment of the present invention, with reference to FIG. 7.

Figure 7:
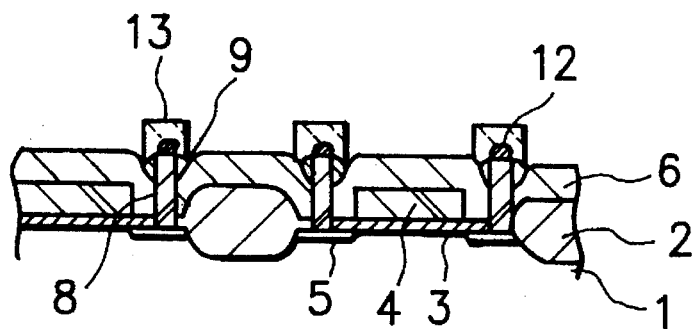
FIG. 7 is a transverse partial sectional view of a semiconductor device according to another embodiment of the present invention.

FIG. 7 illustrates a laminated or layered structure of an essential part of a semiconductor device according to this embodiment, in which like or corresponding parts to the embodiment of FIG. 4 are designated at like reference numerals. Designated at reference numeral 9 is a polycrystalline silicon film consisting of a plurality of pad-like auxiliary contact portions corresponding to the conductive portions of the third conductive layer in the embodiment of FIG. 4, 12 is an insulation film or layer made of a silicon oxide, and 13 is a wiring conductor layer as a fourth conductive layer consisting of a plurality of aluminium conductors each having a substantially square section.

The semiconductor device according to the embodiment illustrated in FIG. 7 comprises like parts to the parts 1 to 8 in the embodiment of FIG. 4, the third conductive layer 9, the insulation layer 12 and the wiring conductor layer 13. Each pad-like conductive portion 9 is formed on the entirety of an exposed side face of a projecting portion of a corresponding one of pillar-like contacts 8. The insulation layer 12 consists of a plurality of insulating filmed portions each respectively formed on the projecting portion of a corresponding one of the pillar-like contacts 8. Each conductor of the fourth conductive layer 13 is formed on the pad-like conductive portion 9 and the insulating portion 12. Each insulating portion 12 has at a bottom region thereof the same sectional size as a corresponding one of the pillar-like contacts 8 and hence of contact holes.

Description will now be made of a process for manufacturing the laminated structure of the semiconductor device of FIG. 7 in accordance with an embodiment of the present invention, with reference to FIGS. 8A to 8D and 9A to 9D.

Process steps illustrated in FIGS. 8A to 8D are substantially the same as those in the embodiment of FIGS. 5A to 5D, while a masking silicon nitride layer 7 is formed by a thickness of about 1500 Å.

Figure 8A:
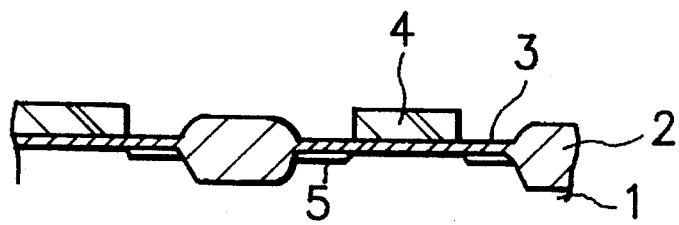
FIGS. 8A to 8D and 9A to 9D are transverse partial sectional views describing a series of process steps for forming a laminated or layered structure of the semiconductor device of FIG. 7.
Figure 8B:
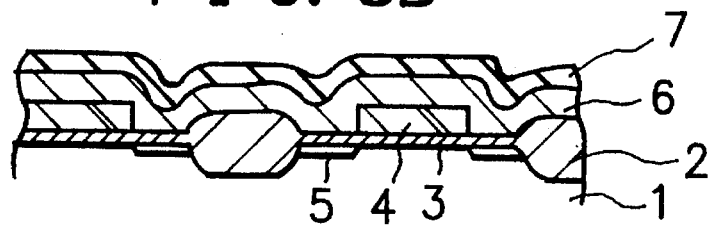
Figure 8C:
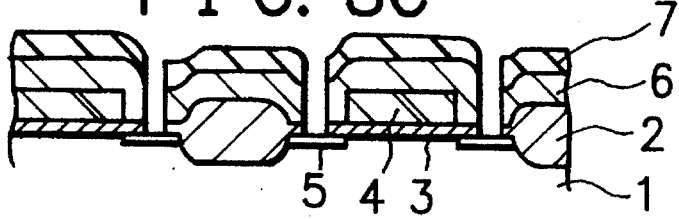
Figure 8D:
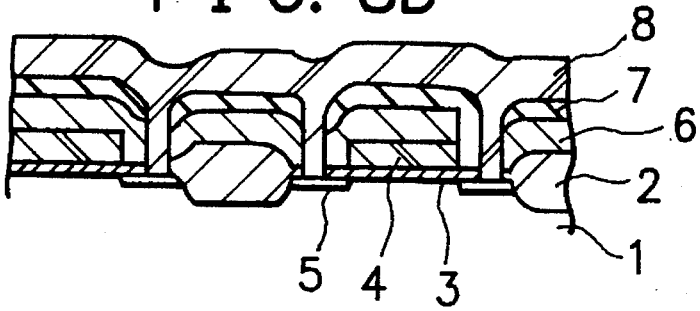
Figure 9A:
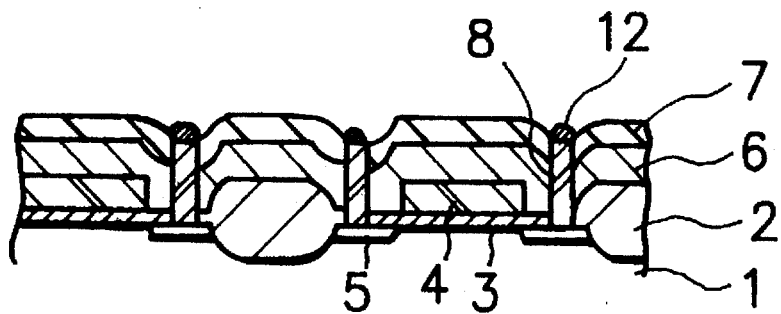

As shown in FIG. 9A, a polycrystalline silicon layer 8 as a second conductive layer formed in a step shown in FIG. 8D is aerotropically or anisotropically etched off, so that a grown portion of the second conductive layer 8 over the masking layer 7, of which the surface is waving in form to have a recess at each location of a straight hole, is removed while a plurality of grown portions of the second conductive layer 8 in straight holes are left as they are. An exposed top part of the pillar-like grown portion 8 over the masking layer 7 is then oxidized by a thickness of about 200 Å to form the insulating portion 12.

Figure 9B:
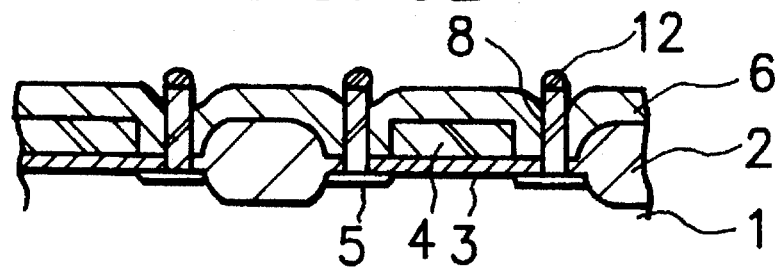

Then, as shown in FIG. 9B, the masking layer 7 is etched off so that the grown portions of the second conductive layer 8 in the straight holes have exposed parts thereof projecting over an insulating layer 6. The second conductive layer is now given in the form of vertically standing pillar-like contacts provided with the insulating portions 12 formed on the top surfaces thereof.

Figure 9C:
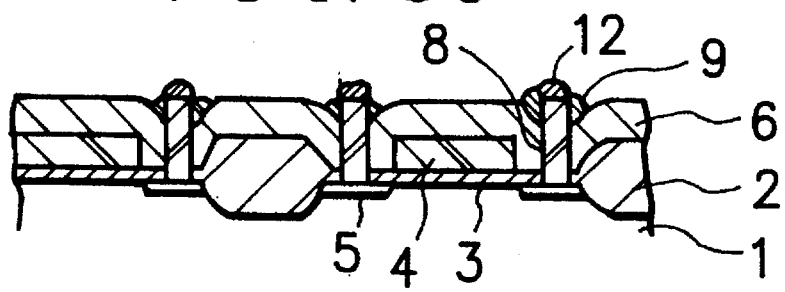

Then, as shown in FIG. 9C, the polycrystalline silicon 9 is let to selectively grow on the entirety of an exposed side face of the projecting portion of each pillar-like contact 8 up to a thickness of about 1000 Å to thereby form a corresponding one of the pad-like conductive portions of the third conductive layer. The polycrystalline silicon 9 may be substituted by another substance selectively growable on the projecting portion of each pillar-like contact 8.

Figure 9D:
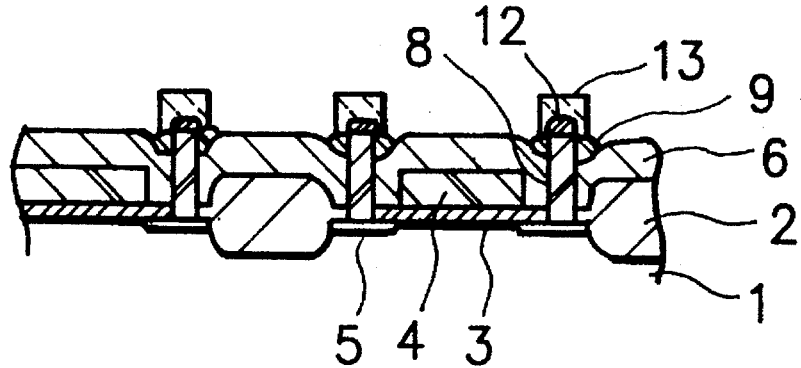

Then, as shown in FIG. 9D, exemplarily an aluminium layer is laminated up to a thickness of about 5000 Å before the patterning to form the wiring conductors 13. The laminated structure shown in FIG. 7 is now completed.

According to the this manufacturing process, the insulating portion 12 effectively prevents substantially straightly etching chemicals in a etching for wiring in FIG. 9D from attacking the projecting portion of the pillar-like contact 8 even if a wiring pattern is erroneously mapped, thus eliminating conventional considerations of a margin for a deviated mapping around a contact. Moreover, an increased contact area with a conductor 13 provides a decreased contact resistance.

Description will now be made of another embodiment of the present invention, with reference to FIGS. 10 and 11.

Figure 10:
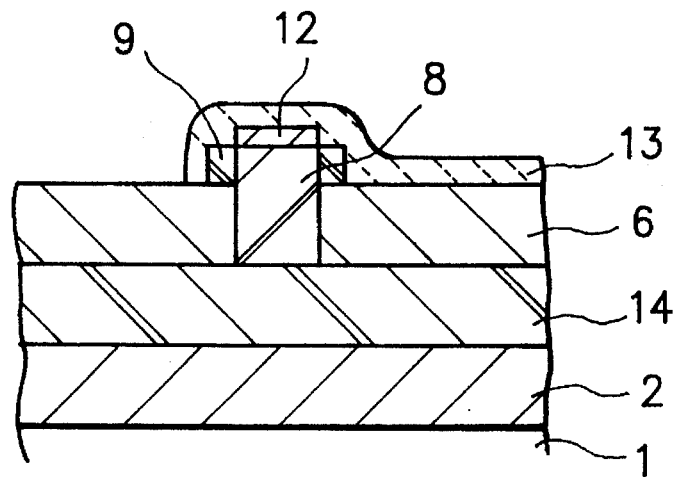
FIG. 10 is a transverse partial sectional view of a semiconductor device according to still another embodiment of the present invention.
Figure 11:
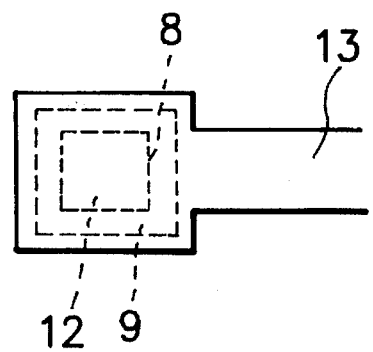
FIG. 11 is a partial plan view of the semiconductor device of FIG. 10.

FIGS. 10 and 11 illustrate a laminated or layered structure of an essential part of a semiconductor device according to this embodiment, in which like or corresponding parts to the embodiment of FIG. 7 are designated at like reference numerals. Designated at reference numeral 14 is a polycrystalline silicon layer that is a wiring conductor layer formed as a first conductive layer in place of the diffusion layer 5 in the embodiment of FIG. 4. An isolation film 2 in FIG. 10 may be substituted by an interlayer insulating film.

To this embodiment, after formation of layers 1, 2 and 14, like manufacturing process steps to FIGS. 8B to 8D and 9A to 9D are applicable.

Description will now be made of another embodiment of the present invention, with reference to FIG. 12.

Figure 12:
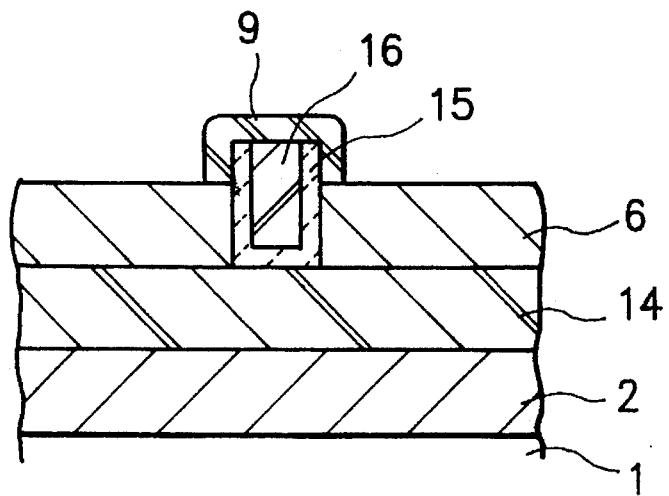
FIG. 12 is a transverse partial sectional view of a semiconductor device according to yet another embodiment of the present invention.

FIG. 12 illustrates a laminated or layered structure of an essential part of a semiconductor device according to this embodiment, in which like or corresponding parts to the embodiment of FIGS. 10 and 11 are designated at like reference numerals. Designated at reference numeral 15 is a lower contact layer made of a spattered tungsten silicide $WSi_2$ or another suitable material relatively low of resistivity and coverage property, and 16 is an upper contact layer made of a CVD processed polycrystalline silicon or another suitable material relatively high of resistivity and coverage property. The lower contact layer 15 consists a plurality of lower pillar-like contacts each respectively formed with a cylindrical central recess. The upper contact layer 16 consists of a plurality of upper pillar-like contacts each respectively formed in the central recess of a corresponding one of the lower pillar-like contacts. The lower pillar-like contact 15 has a projecting portion over an insulating layer 6. On the entirety of an exposed surface of the projecting portion is selectively formed a conductive portion of a third conductive layer 9, which is formed also on a top surface of the upper pillar-like contact 16.

According to this embodiment, an effectively reduced contact resistance is available.

In the respective embodiments described, an arbitrary conductive layer may preferably be made of a tungsten or other applicable substances.

Further, an arbitrary pillar-like contact may preferably comprise a plurality of nested pillar-like contacts to have an increased total coverage to a contact hole or to have a reduced or intentionally increased contact resistance.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor device comprising:

a first conductive layer;

an insulating layer formed on the first conductive layer;

a plurality of contact holes formed through the insulating layer;

a second conductive layer consisting of a plurality of pillar-shaped contacts each respectively formed in a corresponding one of the contact holes;

the pillar-shaped contacts each respectively having a projecting portion projecting above the insulating layer, with an equivalent sectional size to a remaining portion standing in the corresponding contact hole; and a third conductive layer consisting of a plurality of conductive portions each respectively selectively grown on the projecting portion of a corresponding one of the pillar-shaped contacts.

2. The semiconductor device as claimed in claim 1, wherein:

each of the conductive portions of the third conductive layer is formed on a substantially entire surface of the projecting portion.

3. The semiconductor device as claimed in claim 1, wherein:

a selected surface region of the projecting portion comprises a first crystalline, and each of the conductive portions of the third conductive layer comprises a second crystalline selectively growable on the first crystalline.

4. The semiconductor device as claimed in claim 3, wherein:

the first and the second crystalline comprise a polycrystalline silicon.

5. The semiconductor device as claimed in claim 1, wherein:

the projecting portion has the same sectional size as the corresponding one of the contact holes.

6. The semiconductor device as claimed in claim 1, wherein:

each of the pillar-shaped contacts comprises a first contact layer deposited on a top surface of the first conductive layer and a side wall of a corresponding one of the contact holes so that an upper surface of the first contact layer defines a recess, and a second contact layer deposited on the upper surface of the first contact layer, to be disposed in the recess.

7. The semiconductor device as claimed in claim 6, wherein:

the first contact layer consists of a first contact material with a coverage property to conformally cover the top surface of the first conductive layer and the side wall of the corresponding contact hole;

the second contact layer consists of a second contact material with a coverage property to conformally cover the upper surface of the first contact layer; and the coverage property of the first contact material is superior to the coverage property of the second contact material.

8. The semiconductor device as claimed in claim 6, wherein:

the first contact layer consists of a first contact material with a first resistivity;

the second contact layer consists of a second contact material with a second resistivity;

the first resistivity is smaller than the second resistivity.

9. The semiconductor device as claimed in claim 1, further comprising:

a capacitive insulation layer formed on the third conductive layer.

10. The semiconductor device as claimed in claim 1, wherein:

the first conductive layer comprises a diffusion layer formed in a semiconductive substrate, and each of the conductive portions of the third conductive layer comprises an electrode.

11. The semiconductor device as claimed in claim 10, wherein:

the electrode comprises a lower electrode of a capacitor layer.

12. The semiconductor device as claimed in claim 1, wherein:

the first conductive layer comprises a diffusion layer formed in a semiconductive substrate, and each of the conductive portions of the third conductive layer comprises a wiring conductor.

13. The semiconductor device as claimed in claim 1, wherein:

the first conductive layer comprises a wiring conductor layer, and the third conductive layer comprises another wiring conductor layer.

14. The semiconductor device as claimed in claim 1, wherein:

the semiconductor device further comprises another insulating layer consisting of a plurality of insulating portions each respectively formed on a top face of the projecting portion, and a side face of the projecting portion has formed thereon a corresponding one of the conductive portions of the third conductive layer.

15. The semiconductor device as claimed in claim 14, wherein:

each of the insulating portions has the same sectional size as a corresponding one of the contact holes.

16. The semiconductor device as claimed in claim 1, further comprising:

a fourth conductive layer consisting of a plurality of conductive portions each respectively formed on a corresponding one of the conductive portions of the third conductive layer.

17. The semiconductor device as claimed in claim 16, wherein:

each of the conductive portions of the fourth conductive layer comprises a wiring conductor.

18. The semiconductor device as claimed in claim 1, wherein:

the semiconductor device further comprises another insulating layer consisting of a plurality of insulating portions each respectively formed on a top face of the projecting portion, and a fourth conductive layer consisting of a plurality of conductive portions each respectively formed on a corresponding one of the conductive portions of the third conductive layer, and a side face of the projecting portion has formed thereon a corresponding one of the conductive portions of the third conductive layer.

19. The semiconductive device as claimed in claim 18, wherein:

the insulating portions has the same sectional size as a corresponding one of the contact holes.

20. A semiconductor device comprising:

a first conductive layer;

an insulating layer formed on the first conductive layer;

a plurality of contact holes formed through the insulating layer;

a second conductive layer consisting of a plurality of substantially pillar-shaped contacts each respectively formed in a corresponding one of the contact holes;

the substantially pillar-shaped contacts each respectively having a projecting portion projecting above the insulating layer; and a third conductive layer consisting of a plurality of conductive portions each respectively selectively grown on the projecting portion of a corresponding one of the substantially pillar-shaped contacts, wherein the first conductive layer comprises a diffusion layer formed in a semiconductor substrate, and each of the conductive portions of the third conductive layer comprises an electrode, wherein the electrode comprises a lower electrode of a capacitor layer.

21. A semiconductor device comprising:

a first conductive layer;

an insulating layer formed on the first conductive layer;

a plurality of contact holes formed through the insulating layer;

a second conductive layer consisting of a plurality of pillar-shaped contacts each respectively formed in a corresponding one of the contact holes;

the pillar-shaped contacts each respectively having a projecting portion projecting above the insulating layer and a buried portion buried in the corresponding contact hole, said projecting portion and said buried portion having cross sectional sizes which are substantially equal; and a third conductive layer consisting of a plurality of conductive portions each respectively selectively grown on substantially the entire surface of the projecting portion of a corresponding one of the pillar-shaped contacts, wherein electric current is conducted from the first conductive layer to the third conductive layer or vice versa, through the second conductive layer consisting of the pillar-shaped contacts, with the buried portion of each pillar-shaped contact having a bottom end which contacts with the first conductive layer, and with the projecting portion of each pillar-shaped contact contacting with a corresponding one of the conductive portions of the third conductive layer.

* * * * *